(12) United States Patent
Singh

(10) Patent No.: US 7,026,669 B2
(45) Date of Patent: Apr. 11, 2006

(54) LATERAL CHANNEL TRANSISTOR

(76) Inventor: Ranbir Singh, 164 Golden Ash Way, Gaithersburg, MD (US) 20878

(*) Notice: Subject to any disclaimer, the term of this patent is extended or adjusted under 35 U.S.C. 154(b) by 0 days.

(21) Appl. No.: 10/859,576

(22) Filed: Jun. 3, 2004

(65) Prior Publication Data

US 2005/0269661 A1    Dec. 8, 2005

(51) Int. Cl.
*H01L 29/80* (2006.01)
(52) U.S. Cl. .................. 257/279; 257/76; 257/77; 257/287; 257/492; 257/493; 257/615; 257/622
(58) Field of Classification Search .................. 257/76, 257/77, 272, 279, 287, 492, 493, 615
See application file for complete search history.

(56) References Cited

U.S. PATENT DOCUMENTS

| | | | |
|---|---|---|---|
| 5,264,713 A | | 11/1993 | Palmour |
| 5,510,632 A | * | 4/1996 | Brown et al. .................. 257/77 |
| 6,281,521 B1 | | 8/2001 | Singh |
| 6,285,046 B1 | * | 9/2001 | Kaminski et al. ........... 257/263 |
| 6,373,318 B1 | | 4/2002 | Dohnke et al. |
| 6,573,128 B1 | | 6/2003 | Singh |
| 6,822,275 B1 | | 11/2004 | Harada et al. |
| 6,822,842 B1 | | 11/2004 | Friedrichs et al. |
| 2003/0168704 A1 | | 9/2003 | Harada et al. |

OTHER PUBLICATIONS

C Hatfield et al., "DC 1-V Characteristics and RF Performance of a 4H-SiC JFET at 773K," IEEE Transactions on Electron Devices, vol. 45, No. 9, Sep. 1998.
D. Alok et al., "4H-SiC RF Power MOSFETS," IEEE Electron Device Letters, vol. 22, No. 12, Dec. 2001.
R. Singh et al., "High Temperature SiC Trench Gate p-IGBTs," IEEE Transactions on Electron Devices, vol. 50, No. 3, Mar. 2003.
S. Banerjee et al., "1300-V 6H-SiC Lateral MOSFETs with two Resurf Zone," IEEE Electron Device Letters, vol. 23, No. 10, Oct. 2002.
R. Singh et al., "SiC Power Schottky and PiN Diodes,"IEEE Transactions on Electron Devices, vol. 49, No. 4, Apr. 2002.
R. Singh et al., "Development of High-Current 4H-SiC ACCUFET," IEEE Transactions on Electron Devices, vol. 50, No. 2, Feb. 2003.

(Continued)

*Primary Examiner*—Gene M. Munson
(74) *Attorney, Agent, or Firm*—Andrew Booendorf

(57) ABSTRACT

A lateral channel transistor with an optimal conducting channel formed in widebandgap semiconductors like Silicon Carbide and Diamond is provided. Contrary to conventional vertical design of power transistors, a higher, optimum doping for a given thickness supports higher source/drain blocking voltage. A backside gate is insulated from the channel region using a low doped layer of the opposite conductivity type than the channel region to support the rated blocking voltage of the device.

44 Claims, 14 Drawing Sheets

OTHER PUBLICATIONS

Trew et al., "The Potential of Diamond and SiC Electronic Devices for Microwave and Millimeter-Wave Power Applications," Proceedings of the IEEE, vol. 79, No. 5, May 1991.

Clarke et al., "SiC Microwave Power Technologies," Proceedings of the IEEE, vol. 90, No. 6, May 2002.

B. Jayant Baliga, "Trends in Power Semiconductor Devices," IEEE Transactions on Electron Devices, vol. 43, No. 10, Oct. 1996.

Friedricks et al., "Stacked high voltage switch based on SiC VJEFTs," ISPSD, Cambridge, UK, Apr. 14-17, 2003.

G. Kelner et al., "High Temperature Operation of a-Silcon Carbide Buried Gate Junction Field-Effect Transistors," Electronics Letters, vol. 27, No. 12, Jun. 6, 1991.

Meneghesso et al., "Trap Characterization in Buried-Gate N-Channel 6H-SiC JFETS," IEEE Electron Device Letters, vol. 22, No. 9, Sep. 2001.

Rozario et al., "Thermal Cycling Study of SiC BGJFETs," IEEE 1998.

B. Weis et al., "Turn-off and short curcuit behaviour of 4H SiC JFETs," IEEE 2001.

* cited by examiner

LATERAL CHANNEL TRANSISTOR

TECHNICAL FIELD

The following description relates generally to semiconductor devices, and in particular to power and microwave devices using widebandgap semiconductors.

BACKGROUND

Most conventional semiconductor power devices are almost exclusively formed using silicon (Si). Due to the relative maturity of the use of this semiconductor, the performance of conventional power devices to carry high currents and block high voltages is closely approaching the theoretical limit for Si. For example, power MOSFETs made using Si have undergone many improvements over the past two decades and allowing them to block 30 to 1,200 volts while providing relatively low on-state resistance values.

However, there are many applications for power devices that require the ability to carry high currents and block voltages in the range of 600 V to 15 kV (and greater). These applications include motor control, power supply, lighting ballast, power transmission and generation, and utility power conversion. Unfortunately, the overall performance of power devices made using Si is poor for this voltage range, and the lack of such power devices represents the primary limitation in realizing circuits for these applications. In fact, if high voltage devices that support such high currents and operate at frequencies of one to 100 kHz were available, they would revolutionize power utility applications and result in power savings of as much as $20 billion in the United States.

One recent development in semiconductor power devices is the use of Intelligent Power Modules (IPMs). IPMs use low voltage CMOS circuitry that may be integrated with power devices. Other examples of intelligent power devices include discrete integrated power devices that detect unacceptable current, voltage, and temperature conditions. However, the relatively low blocking voltage of semiconductor power devices made using Si limits the application of these devices in majority carrier devices (e.g., devices that rely on resistive current transport) to 1200 V or less.

For higher power devices (e.g., those blocking voltages greater than 1200 V), bipolar devices, such as, insulated gate bipolar transistors (IGBTs) and Thyristors have been used. While these devices offer acceptable on-state performance, they suffer from relatively slow switching speeds and poor performance at high temperatures.

Other power devices that have been researched also suffer from various deficiencies. For example, Bipolar Junction Transistors (BJTs) use a current control gate rather than a preferable voltage control gate. Many vertical junction field effect transistors (JFETs) operate in a "normally-on" mode during their on-state condition; however, JFETs with the preferable "normally-off" mode have poor on-state resistances. Finally, thyristors have high on-state voltage drops (because of their inherent junction drop) and slow switching speeds.

A variety of power devices using silicon carbide (SiC) have been researched and implemented in an attempt to provide devices that block high voltages and carry high currents. One switching power device is the vertical power MOSFET. However, vertical power MOSFETs made using SiC suffer from poor performance and poor reliability because of low inversion layer channel mobility. In addition, the tunneling current between SiC and the gate dielectric limits the reliability of these power devices made using SiC during their long term operation.

Another area in which semiconductor devices are being used is the microwave transistor. Microwave transistors are expected to work at very high frequencies, for example, at 800 MHz to 10 GHz (and greater). Most conventional microwave devices are formed using gallium arsenide (GaAs) and Si structures. For example, GaAs structures include the high electron mobility transistor (HEMT), the Heterojuncntion Bipolar transistor (HBT), and the pseudomorphic HEMT. These transistors are the most commonly used lower power (e.g., fractional to 10 W) transistors. Their applications include cell phone handsets and low power networking devices.

Higher power (e.g., especially in the L-Band (400 MHz to 1 GHz), S-Band (1–3 GHz) and X-band (7–10 GHz)) transistor applications also exist including military radars and cellular phone base-station applications. These transistors may be combined with passive components to form integrated circuits that provide higher usable power levels and match external circuit components. Such integrated circuits are called microwave and millimeter wave integrated circuits (MMICs).

One example of a high power microwave device formed using SiC is the lateral power Metal-Semiconductor FET (or MESFET). A MESFET is operated by controlling the source to drain current using a Schottky gate located between these terminals (known as a T-gate). Due to the extremely high current densities in the localized region inside the MESFET, the junction temperature at the Schottky contact may significantly exceed the ambient temperature and result in a high leakage current at the gate and premature breakdown. As a result, the source terminal of the microwave MESFET must be firmly held at ground potential to achieve stable performance.

To hold the source terminal of a microwave MESFET at ground, via holes inside the source terminal must be placed through the wafer to the backside metal contacts. As a result, the yield of chips made using ultra-fine lithography is reduced (and therefore the cost of producing such chips is increased). Because the T-gate significantly increases the cost of making these chips, the use of MESFETs for many high power density microwave applications may ultimately be limited.

As an alternative to MESFETs, microwave JFETs with p-type gate regions located between the source and drain contacts have been used in an attempt to provide better robustness. However, JFETs also suffer from poor high frequency performance in microwave applications because of the challenge in making small gate widths that minimize gate to source and gate to drain capacitances.

SUMMARY

In one general aspect, a lateral channel transistor (LCT) formed in a widebandgap semiconductor includes one or more layers of the widebandgap semiconductor having a first conductivity and a first and a second surface; one or more layers of the widebandgap semiconductor having a second conductivity formed on the first surface of the one or more layers of the second conductivity, including at least a resurf layer; a gate formed on the second surface of the one or more layers of the first conductivity; a source region in contact with the resurf layer; a drain region in contact with the resurf layer spaced apart from the source region; a current conduction path in the one or more layers of the second conductivity type between the source region and the drain region; and a pinch-off region formed in the resurf layer between the source region and the drain region having a width less than the distance between the source region and the drain region to pinch-off the current conduction path.

The one more layers of the first conductivity may include a substrate layer having a carrier concentration of dopant atoms of 0 cm$^{-3}$ to 1×10$^{22}$ cm$^{-3}$ and a thickness of 100 to 500 µm. The resurf layer has a carrier concentration of dopant atoms of 1×10$^{15}$ cm$^{-3}$ to 1×10$^{19}$ cm$^{-3}$ and a thickness of 0.01 to 5 µm. The one or more layers of the first conductivity also may include a backgate layer. The backgate layer has a carrier concentration of dopant atoms of less than 10$^{17}$ cm$^{-3}$ and a thickness of 0.1 to 200 µm.

The one or more layers of the second conductivity may include a channel layer formed between the resurf layer and the one or more layers of the first conductivity. The pinch-off groove partially penetrates the channel layer. The channel layer may have a carrier concentration of dopant atoms of 1×10$^{13}$ cm$^{-3}$ to 1×10$^{18}$ cm$^{-3}$ and a thickness of the channel region is 0.01 to 10 µm.

The LCT has a lateral breakdown voltage between the source region and the drain region and a vertical breakdown voltage between the drain region and the gate. In one implementation the vertical breakdown voltage is greater than or equal to the lateral breakdown voltage.

In another general aspect, the one or more layers of the second conductivity may include a channel layer formed between the resurf layer the first surface. The source region may be embedded in the channel layer and the pinch-off region is formed in the resurf layer beginning at the source region.

In another general aspect, the pinch-off region of the LCT is implemented using a pinch off groove or a low doped region or a p conductivity blocker region. The pinch-off region may be 0.1 to 20 µm wide. The pinch-off region may be positioned at a distance of 0.1 µm to 100 µm from the source region and 1 to 200 µm from the drain region. The pinch-off region may be filled with a dielectric including one of silicon dioxide, silicon nitride, polyimide, deposited silicon carbide, and deposited diamond.

In another general aspect, the region below the pinch-off region and second surface of the one or more layers of the first conductivity may be doped with a uniformly decreasing doping profile.

In another general aspect the semiconductor has a bandgap EG greater than 2 eV and less than 8 eV and is silicon carbide. The face of the silicon carbide may be one of 0001, 000-1, and 11-14 20. The semiconductor also may have a bandgap EG greater than 2.1 eV and less than 4 eV and be implemented using diamond. The semiconductor also may have a bandgap EG of approximately 5 eV and be implemented using aluminum nitride. The semiconductor also may have a bandgap EG of approximately 6.1 eV and be implemented using gallium nitride.

In another general aspect, the LCT may have a blocking voltage of 300 V to 25 kV. The LCT may have a blocking gain of greater than or equal to 20, where the blocking gain is expressed as BV/V$_{pinch}$ and BV is the voltage blocked at the drain and the V$_{pinch}$ is the pinch-off voltage causing pinch-off of the conduction path. The LCT may have a specific on resistance of less than 300 mΩ-cm$^2$.

In another general aspect, the first conductivity is P type and the second conductivity is N type and the conductivity of the source region is a highly doped p+ type and the conductivity of the drain is a highly doped n+ type.

The LCT also may include a passivating dielectric layer formed between the source region and the drain region covering the pinch-off region. The LCT also may a compensating layer between the passivating dielectric layer and the resurf layer configured to shape a lateral electric field of the LCT.

The lateral channel transistor provides high voltage blocking using wide band gap semiconductors that offer high breakdown electric fields and acceptable carrier mobility. The transistor may be grown from layers with low doping or made from semi-insulating and insulating bulk wafers thereby increasing the yield of chips including such transistors. The transistor also may be easily fabricated using a limited number of yield limiting ion implantation steps. The transistor may be made using all kinds of polytypes and faces of silicon carbide, gallium nitride, aluminum nitride, and semiconducting diamond.

The transistor has a significantly lower on-state resistance than that obtained from conventional structures using silicon carbide and diamond.

The transistor also has a significantly lower capacitance between the gate and the drain, the gate and the source, and the source and the drain than conventional transistors made using silicon carbide and diamond.

Other features will be apparent from the description, the drawings, and the claims.

DESCRIPTION OF DRAWINGS

Like reference symbols in the various drawings indicate like elements.

DETAILED DESCRIPTION

The following description of the various implementations and embodiments illustrates general concepts of the invention which may suggest various alternatives to those skilled in the art. For example, the description makes reference to certain layers and regions being formed of a first conductivity type (e.g., n-type) and a second conductivity type (e.g., p-type) in addition to various dopings (e.g., + and −) of these areas. However, complementary devices also may be produced according to the descriptions below, such as, for example, the first conductivity type may be a p-type semiconductor and the second conductivity type may be an n-type semiconductor.

The various layers and regions may be fabricated using a number of conventional semiconductor fabrication techniques including solid source crystal growth, molecular beam epitaxy, gas source metal-organic chemical vapor deposition, wafer bonding, lithography, thermal oxidation, metallization, etching, and/or combinations thereof.

It also will be appreciated that the figures show general concepts and that sizes and dimensions of layers or regions may be exaggerated for illustrative purposes to show general structures, and are not necessarily to scale. In addition, references to a layer being formed on another layer or substrate may contemplate that additional layers intervene. Likewise, a referenced layer may include implementations formed of multiple layers or doping regions.

Lateral Channel Transistor Cell Structure

The device structures described below are for fabrication in all semiconductors with bandgap (EG) greater than or equal to approximately 2 eV and less than or equal to approximately 8 eV. For example, this includes silicon carbide (with EG range of 2.1 eV to 4 eV), diamond (EG 5 eV), aluminum nitride (EG 6.1 eV), and gallium nitride (with EG range 3 eV to 5 eV). In addition, all faces of the crystal structure of these semiconductors may be used. For example, faces for SiC include 0001 plane (i.e., the silicon face), 000-1 (i.e., the carbon face), or other intermediary faces like 11-20.

Figure 1:
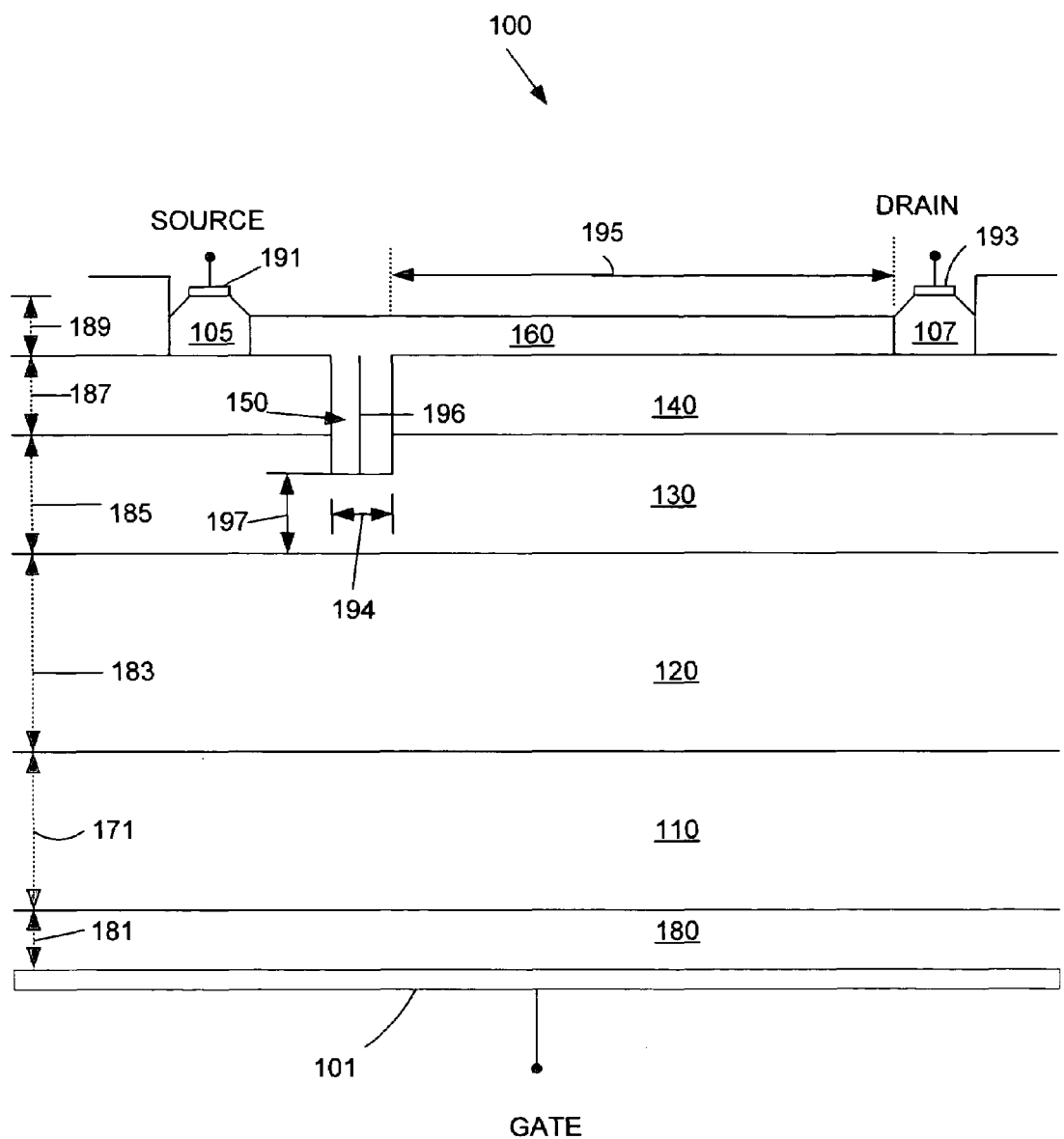
FIG. 1 shows an exemplary cell of a lateral channel transistor having a backside gate and optimally doped conduction path between the source and the drain.

FIG. 1 shows the structure of a lateral channel transistor (LCT). As shown by the exemplary implementation illustrated in FIG. 1, a cell 100 of the LCT includes a backside gate terminal 101 with an optimally doped conduction path between a source region 105 and a drain region 107. The cell 100 may include up to four or more layers including a first layer 110, a second layer 120, a third layer 130, and a fourth layer 140.

The LCT also may include a pinch-off region located between the source region 105 and the drain region 107. The pinch-off region may be implemented using, for example, a groove or trench 150, a blocker region, or a low doped region. The groove 150 and the area between the source region 105 and drain region 107 may be filled with a passivating dielectric 160.

The first layer 110 may be formed using a p-type substrate having a backside metallized gate terminal 101. In one implementation, the layer 110 may have a thickness ($t_{substrate}$) 171 of approximately 100–500 µm with a doping of zero to $10^{22}$ cm$^{-3}$.

An optional very thin highly doped backside layer 180 of the same conductivity type as layer 110 may be ion implanted in the substrate 110 or epitaxially grown thereon having a thickness 181 of 0.01 to 10 µm. The highly doped backside layer 180 may be provided to prevent a vertical electric field from reaching the metallized gate terminal 101.

The second layer 120 may be formed of a low doped p-type conductivity semiconductor between layer 110 and layer 130. The layer 120 may be grown (e.g., using a high quality epitaxial process) on layer 110 to a thickness ($t_{backgate}$) 181 of one to 200 µm with an acceptor doping $N_A$. If layer 110 has a doping less than or equal to 1017 cm$^{-3}$, layer 120 is optional. However, when the doping of layer 110 exceeds $10^{17}$ cm$^{-3}$, layer 120 should be included with a doping $N_A$, for example, of $10^{13}$ cm$^{-3}$ to $10^{18}$ cm$^{-3}$. A more precise description of how to determine $N_A$ is given below.

The third layer 130 may be grown over layer 120 or be ion implanted to provide a channel with doping $N_D$. The layer 130 may be formed as an optimally doped N-type semiconductor of thickness 185 of 0.01 to 10 µm. The layer 130 is optional and may be included between layer 140 and layer 120 (or layer 110 if layer 120 is not present), for example, to account for difficulty in providing a precise etch in layer 140 to provide groove 150. The layer 130 may have a doping $N_D$ that is lower than the doping of layer 140 to provide a better fabrication yield. A doping $N_D$ of $10^{13}$ cm$^{-3}$ to $10^{18}$ cm$^{-3}$ is acceptable.

The layer 140 may be epitaxially grown or implanted with an optimal doping $N_{resurf}$. Tolerance on the doping $N_{resurf}$ and thickness of layer 140 ($t_{resurf}$) 187 is roughly plus or minus 50% from the optimal doping calculated using the design equations given below. Layer 140 may be doped from $10^{15}$ cm$^{-3}$ to $10^{19}$ cm$^{-3}$ having a thickness of 0.01 to 1.0 µm.

The source region 105 and drain region 107 may be formed of highly doped n+ areas to form low resistance ohmic contacts. The source region 105 and the drain region 107 may be ion implanted (in layer 140) or epitaxially grown (on layer 140) with doping, for example, greater than $10^{17}$ cm$^{-3}$ with a thickness 189 of 0.01 to 1 µm. The source region 105 and the drain region 107 are used to provide ohmic contacts for the source terminal 191 and drain terminal 193.

An optimum depth groove 150 may be etched through layer 140 using a reactive ion etching or selective area oxidation. The groove 150 may be placed close to the n+ source region 105. If layers 120 and/or layer 130 are not present, the groove 150 is formed to a sufficient depth ($D_{groove}$) 196 such that the channel of the LCT is pinched-off at the transistor "pinch-off" voltage ($V_{pinch}$). The thickness of the channel 197 ($t_{channel}$) is the distance between the bottom of the groove 150 and layer 130/120 junction, for example, 0.01 µm to 5 µm. The groove 150 may be formed at a width ($W_{pinchoffgroove}$) 194 of 0.1 to 20 µm. If layer 130 is not present, the thickness of the channel 197 ($t_{channel}$) may be 0.01 µm to 2 µm. The groove 150 may be filled with an appropriate passivating dielectric 160, such as, for example, silicon dioxide, silicon nitride, polyimide, deposited SiC, deposited diamond, or other high-k dielectrics. The groove 150 may be located beginning at a distance from the source region 105 of 0.1 µm to 100 µm. The groove 150 may be located beginning at a distance ($L_{drift}$) 195 of 0.1 to 200 µm from the drain region 107, according to the design conditions described in further detail below.

In another implementation of the LCT of FIG. 1, the source region 105 may be formed using a p+ injector instead of an n+ region. As a result, the device may be operated in a bipolar mode (instead of a unipolar-mode as described above). In this variation, instead of a drift current conduction from the source to the drain, a diffusion method of current conduction is provided. The source region 105 forms a pn junction and injects minority carriers in the forward bias mode of operation. A higher current density is provided by this structure because of the lower resistance offered during minority carrier injection current transport (as compared to the drift mode, i.e., a purely resistive structure).

Figure 2:
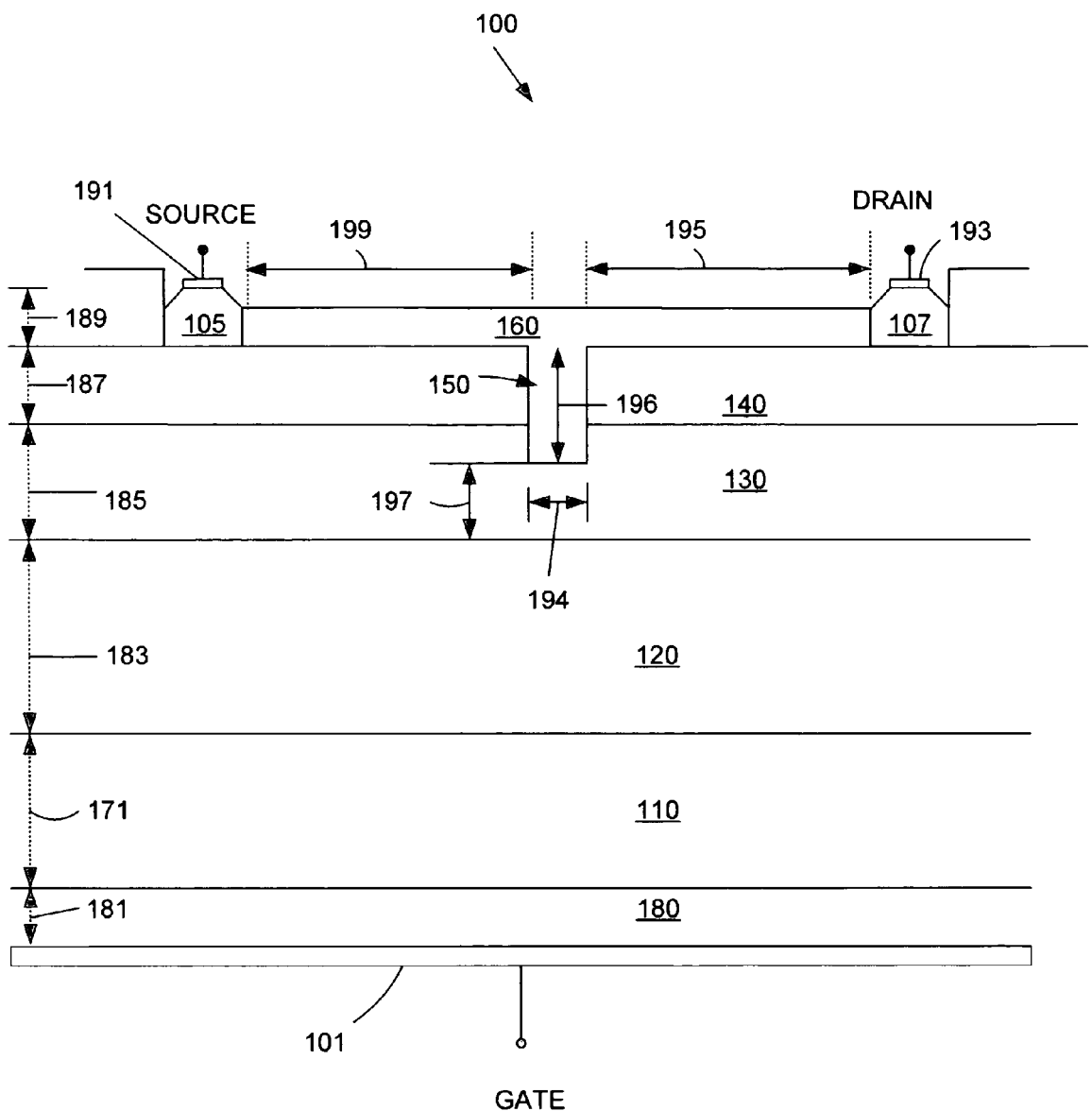
FIG. 2 shows an exemplary lateral channel transistor with symmetric blocking capability.

FIG. 2 shows another exemplary implementation for a symmetric blocking version of the LCT. As shown in FIG. 2, the pinch-off groove 150 is formed substantially equidistant between the source and the drain regions. In other words, the distance between the groove 150 and the drain 107 (195) equals distance between the groove 150 and the source region 105 (199).

LCT Design

The layer 140 ensures that the electric field at the pinch-off groove 150 and the surface of layer 140 is sufficiently low (e.g., in one implementation 0 V/cm) when the LCT is blocking its highest voltage (BV). In one implementation, an electric field of 0 V/cm may be maintained at the surface if the electric field at the voltage blocking junction (e.g., the junction between layer 120 and layer 130; layer 120 and layer 140 (if layer 130 is not present); or layer 110 and layer 140 (if layers 120 and 130 are not present)) is close to the critical breakdown electric field $E_{cr}$ of the semiconductor. Approximate values for $E_{cr}$ for various semiconductors are:

$E_{cr, Si}$: 0.25 MV/cm $E_{cr, SiC}$: 2 MV/cm $E_{cr, C}$: 5 MV/cm

The optimal doping of layer 140 by thickness of layer 140 may be expressed as:

$$\frac{1}{L_{Drift}} \int_0^{tresurf+tchann} \int_0^{L_{Drift}} N_{resurf}(x, y) \partial x \partial y = \frac{\varepsilon \times E_{cr}}{q}$$

where $\in$ is the dielectric constant of the semiconductor (e.g., 11.9X$\in_r$ for Si, 9.7X$\in_r$ for SiC, and 5X$\in_r$ for diamond) where $\in$r is the permittivity for air (e.g., 8.854×10$^{-14}$ F/cm) and 'q' is the electronic charge (1.602×10$^{-19}$ C). If the doping in the layer 140 is constant along the drift length 195 and its depth ($t_{resurf}$), the optimum charge in the layer 140 may be expressed as $$N_{resurf} \times t_{resurf} = \frac{\varepsilon \times E_{cr}}{q}$$

Although constant doping of layer 140 is assumed in the following analysis, uniformly varying doping in the layer 140 also may be provided, for example, for a LCT blocking greater than 2 kV, and/or to provide high linearity, as explained in further detail below.

In this case, BV (i.e., the highest voltage blocked at the drain) may be expressed as the lesser of the two:

$BV_{Lat}$=(Between 1 and 0.5)×($L_{Drift}$×$E_{cr}$) (the approximate lateral breakdown condition); and $$BV_{Vert} = \frac{1}{2} \times t_{backgate} \left( E_{cr} + \frac{qN_A}{\varepsilon} t_{backgate} + \frac{1}{2} \times \frac{qN_A^2}{\varepsilon N_{Subs}} t_{backgate} \right)$$

the approximate vertical breakdown condition) where $N_{subs}$ is the substrate doping. These equations express two competing breakdowns: a vertical breakdown and a lateral breakdown. To design a LCT with the lowest on-resistance for a given blocking voltage, the vertical blocking voltage should be greater than or equal to the lateral blocking voltage. Approximate formulae for the lateral and the vertical breakdowns are given above. There is a trade-off between the blocking voltage capability of the transistor and its on-resistance. In this case, the higher the breakdown voltage, the higher the on-resistance.

While these general formulae express the highest voltage blocked by the drain of the LCT, the actual BV of any given LCT may depend on a variety of factors, such as, for example, processing, edge termination, and other device dimensions.

Figure 3:
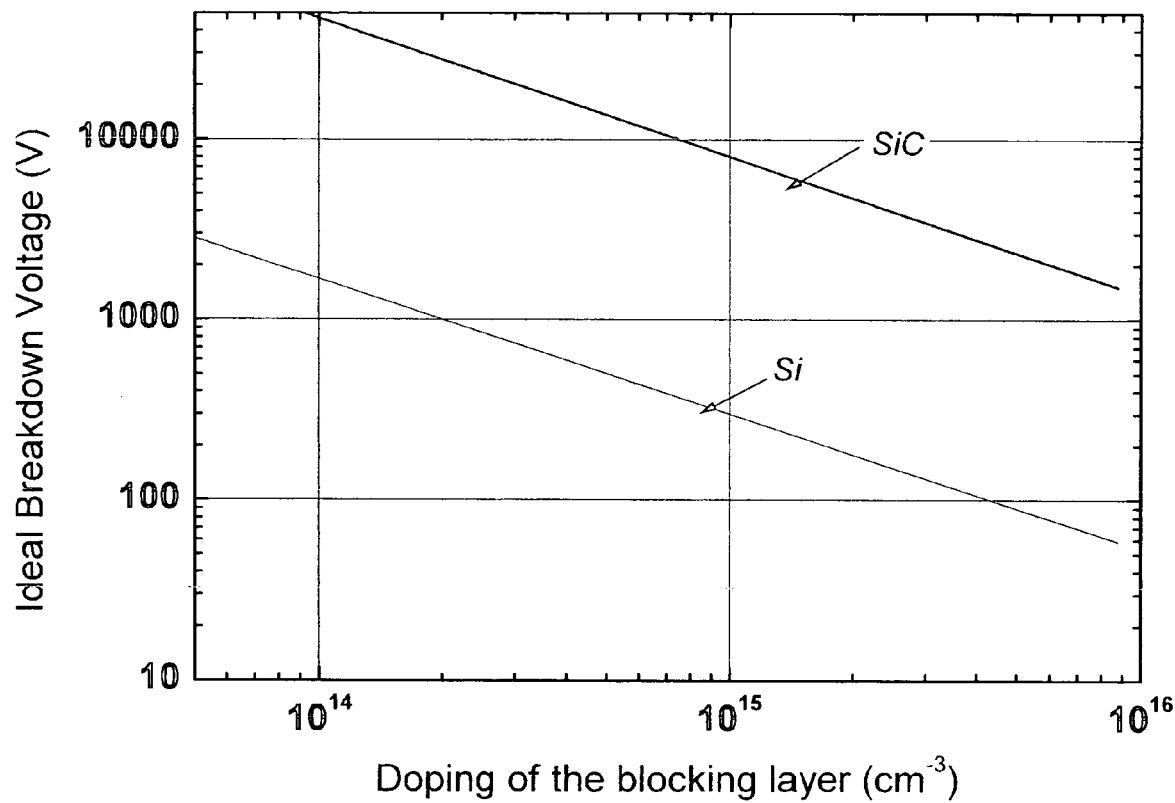
FIG. 3 shows an exemplary illustration of ideal breakdown voltage versus doping of the blocking layer for silicon and silicon carbide.

A comparison of the ideal breakdown voltage versus the doping of the blocking layer (for a LCT formed using Si and SiC) is illustrated in FIG. 3. As shown in FIG. 3, as the doping of the blocking layer is decreased, higher ideal breakdown voltages may be attained for the vertical breakdown condition.

$V_{pinch}$ of the LCT may be defined as the source to gate reverse bias at which a portion of the channel region (e.g., between the p backgate and the pinch-off groove) is completely depleted allowing no current to flow between the source and the drain. $V_{pinch}$ may be expressed as:

$$V_{pinch} = \frac{1}{2} \frac{q \times t_{chann}^2}{\varepsilon} \times \frac{N_D}{N_A} (N_A + N_D)$$

The doping $N_A$ may be determined by the desired pinch-off voltage rating of the LCT. The doping and thickness of layer 130 should be such that the vertical blocking voltage is greater than the blocking voltage rating of the LCT.

However, if the channel region is formed in layer 140, (i.e., without a separate channel layer 130), the pinch-off voltage is determined by the thickness of the resurf layer under the pinch-off groove ($t_{pinch}$). Therefore, the pinch-off voltage for this case may be expressed as:

$$V_{pinch} = \frac{1}{2} \frac{qN_{resurf} \times t_{pinch}^2}{\varepsilon}$$

Figure 4:
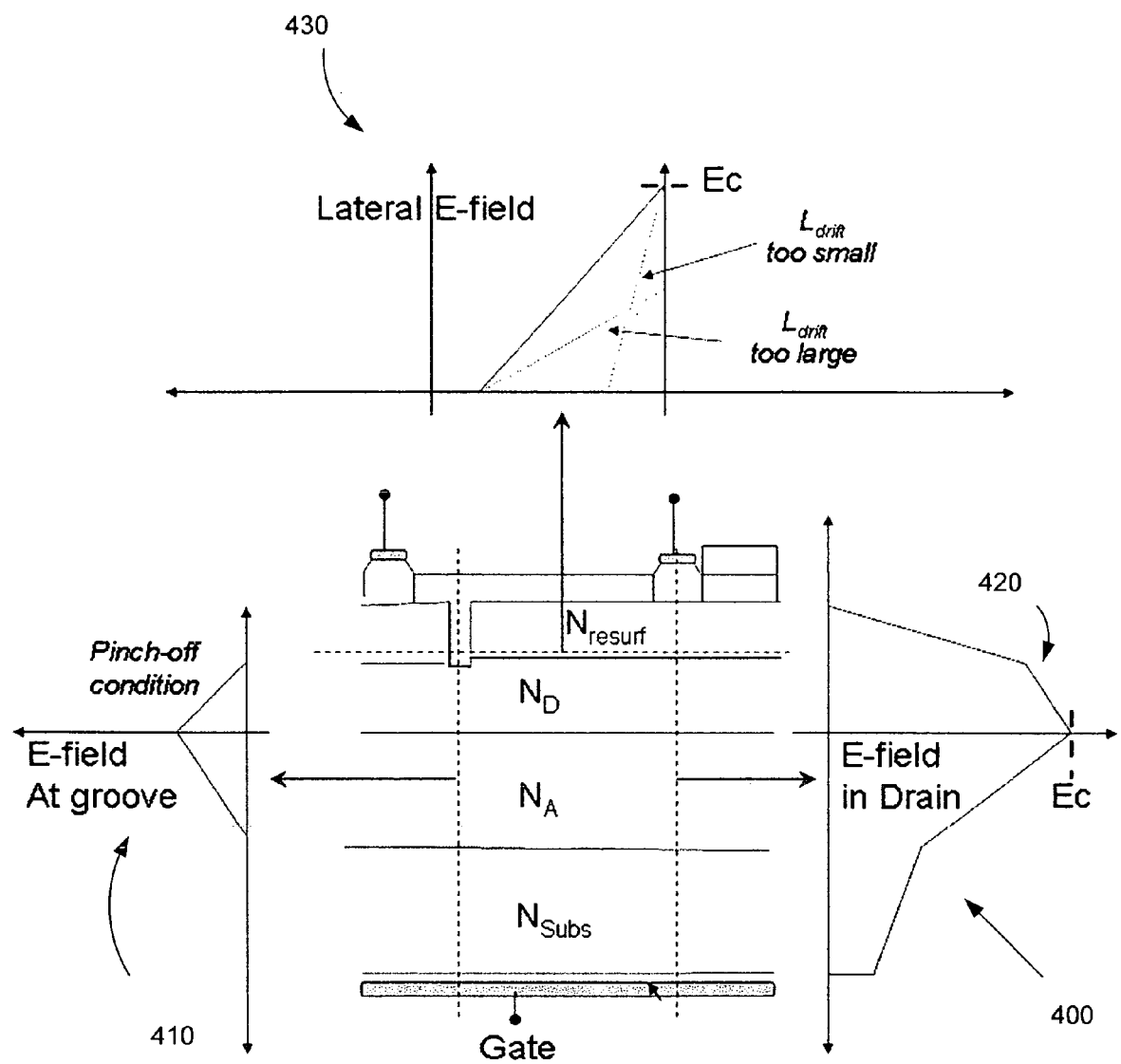
FIG. 4 shows an exemplary lateral channel transistor structure with illustrations of the vertical and lateral electric fields.

FIG. 4 illustrates several electric fields in a cell 100 of the LCT shown in FIG. 1, when $V_{gate}$=0 V, $V_{source}$=$V_{pinch}$, and $V_{drain}$=BV The electric field profile 410 at the pinch-off groove, the vertical electric field 420 along the drain-gate junction, and the lateral electric field 430 close to the PN junction are plotted in FIG. 4. The pinch-off condition is defined as the source to gate reverse biased voltage when the low doped part of the channel is fully depleted, thereby preventing the flow of current from the source to the drain. Under this condition, the depletion region formed at the PN junction between the backgate (layer 120) and the channel region (layer 130) extends to the surface of the lower doped part of the channel region, and "pinches off" the current flow path.

An important design and performance parameter is the blocking gain (BG) of the LCT. The BG may be defined as $$\text{Blocking Gain}(BG) = \frac{BV}{V_{pinch}}$$

It may be advantageous in some applications to have a high BG for a given BV rating of the device being implemented. The LCT provides a high BG, for example, of 19 or greater which is not provided by conventional JFETs (including buried channel JFETs). The high BV may be achieved by the use of low doped layers 110 and 120, which increases the maximum sustainable voltage between the drain and the gate terminals. In marked contrast, conventional buried gate JFET designs do not take into account the drain to gate breakdown voltage which results in their low BV.

For example, consider a LCT with a $V_{pinch}$ of 30 V, BV of 1200 V where the gate is held at ground potential. Below a source and drain voltage of 30 V, the conduction path between the source and drain will conduct current. At a source voltage of 30 V, the electric field 410 at the pinch-off groove 150 is shown in FIG. 4. When the drain voltage is increased, the lateral electric field 420 between the gate-drain junction increases until it approaches the critical electric field of the semiconductor $E_{cr}$. When the applied drain voltage causes the gate to drain junction electric field to exceed $E_{cr}$, the LCT suffers a gate to drain breakdown (i.e., a vertical breakdown).

The lateral breakdown voltage may be determined by the length of the drift region (i.e., $L_{drift}$). $L_{drift}$ may be determined so that the lateral electric field 430 is near zero V/cm at the low doped channel region when the full BV is applied at the drain terminal. The lateral electric field along the lateral direction decreases monotonically from the drain terminal towards the pinch-off groove 150, expressed as $$E(x) = \frac{qN_{resurf}}{\varepsilon} x,$$

where x=0 corresponds to the location of the pinch-off groove. A maximum voltage on the drain is supported with the least drift region resistance for the drift region length, $$L_{Drift} = \frac{2 \times BV_{Lat}}{E_{cr}}$$

(assuming vertical breakdown does not occur before BV is achieved). If $L_{Drift}$ is sufficiently long (as specified by this equation), the value of BV may be determined using the previously defined lateral breakdown formula. In one implementation, an optimum charge (i.e., doping X thickness) of the layer 140 corresponds to a linearly increasing charge from the pinch-off region towards the high voltage drain terminal, which may be achieved using a stepwise increase in thickness or doping towards the drain terminal.

The pinch-off groove 150 may be filled with a high breakdown electric field dielectric or passivating dielectric 160, such as, for example, silicon dioxide $E_{cr}$~12 MV/cm) or silicon nitride ($E_{cr}$~8 MV/cm). The width of the pinch-off groove should be wide enough such that the dielectric inside the groove 150 does not breakdown. Therefore, $W_{pinchoffgroove}$ may be expressed as:

$$W_{pinchoffgroove} > \frac{BV}{E_{cr, diel}}$$

where $E_{cr,diel}$ is the critical electric field of the dielectric used to fill the pinch-off groove.

The channel region below groove 150 and the PN junction may be doped with a uniformly decreasing doping profile. Such a profile can be achieved using an optimized ion implant regimen, or by using the tail portion of an ion implant used to form layer 140. Alternatively, the profile also can be provided using dopant diffusion. For example, profiles include tail of Gaussian profile, tail of any moment of a Pearson distribution, $$N_D(y) \propto \frac{1}{y}, N_D(y) \propto \frac{1}{y^2},$$

or increasing power of 1/y.

Operation of the LCT

The LCT may be operated in at least two different circuit modes: a common-source mode and a common-gate mode. In the common-source mode, the source terminal is placed at ground potential, and the gate terminal is varied between ground and $V_{pinch}$. However, the source and gate voltages may swing more than this range during some switching transients. The drain voltage may be varied from ground to BV.

In the common-gate mode, the gate is placed at ground potential, and the source is varied between ground and $V_{pinch}$. However, the source and gate voltages may swing more than this range during some switching transients. The drain voltage may be varied between ground and BV.

In the common-source mode or the common-gate mode, BV is greater than $V_{pinch}$. In one implementation, the LCT may be designed, such that, BV is significantly greater than $V_{pinch}$ (e.g., a range of $V_{pinch}$ is 0 V to 100 V, and BV is 300 V to 25 kV). When the source and gate equal 0 V, a small drain bias causes current to flow between the source and the drain terminals through layer 140 and the channel region (i.e., layer 130). As the source to gate bias is increased, the reverse bias between the PN junction (e.g., between layer 120 and layer 130; or layer 120 and layer 140; or layer 110 and layer 130; or layer 110 and layer 140) also increases. As a result, the depletion from the gate constricts the current flow path until the source to gate voltage reaches a level where the conducting channel is completely depleted between the gate and the pinch-off control groove 150.

When the conduction path is completely pinched off, the drain voltage can be increased until the BV of the transistor is reached. The BV is supported between the PN junction layers (e.g., between layer 110/layer 120 and layer 130/layer 140).

Layout of the LCT

Figure 5:
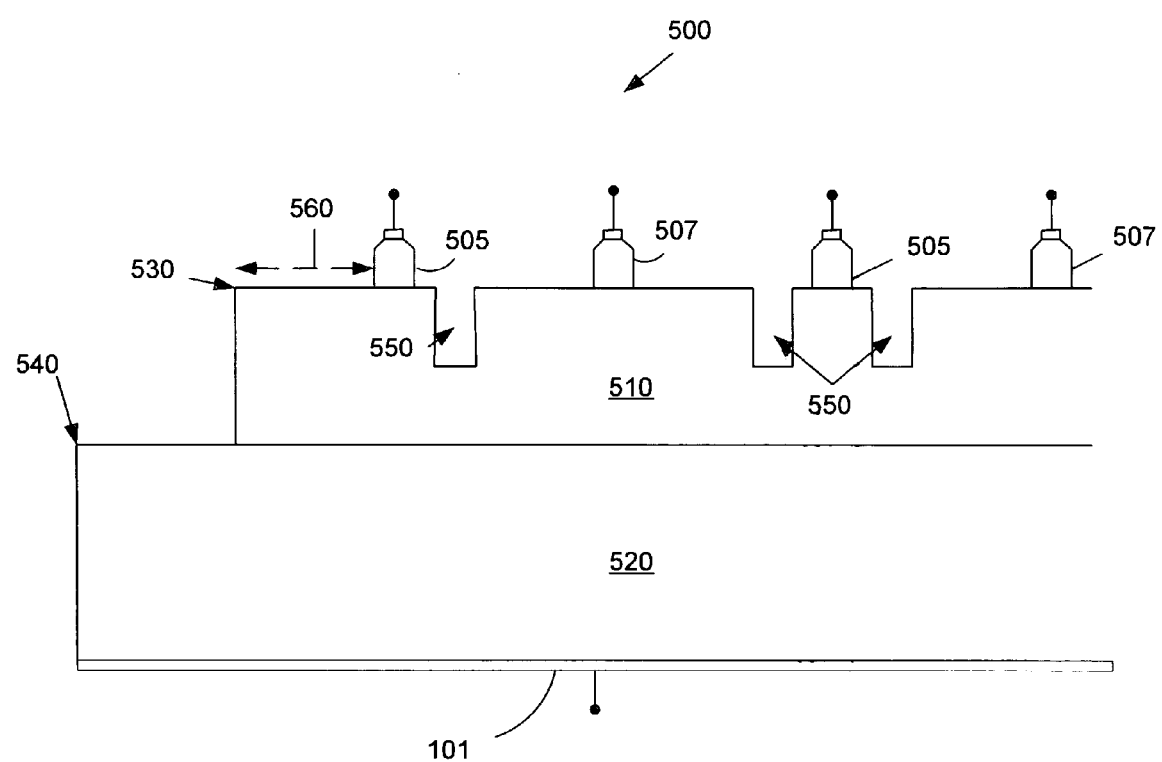
FIG. 5 shows an exemplary power transistor formed using the cells of FIG. 1.

The structure of a cell of the LCT is shown in FIG. 1 and described above. However, an entire power transistor chip may be formed by creating mirror images of the cell 100 in FIG. 1 that are repeated. For example, FIG. 5 shows a schematic diagram of the cell 100 of FIG. 1 repeated and mirror imaged to form a power transistor chip 500. As shown in FIG. 5, one or more n type layers 510 are formed on one or more p layers and/or a substrate 520. In addition, a number of source regions 505 and drain regions 507 are formed on the n type layers 510. The edge 530 of the one or more n-type layers 510 does not necessarily extend to the edge 540 of the substrate 520. A groove 550 may be formed in the n-type layer 510 between each source region 505 and drain region 507.

To confine the electric field, the top n-type layer(s) 510 (e.g., formed by layer 130 and/or layer 140) may extend beyond an outermost source 505 by a predetermined length ($L_{extend}$) 560. $L_{extend}$ may be determined by the BV rating of the device for which the LCT is to be used, such as, for example, between zero to 200 μm.

Figure 6:
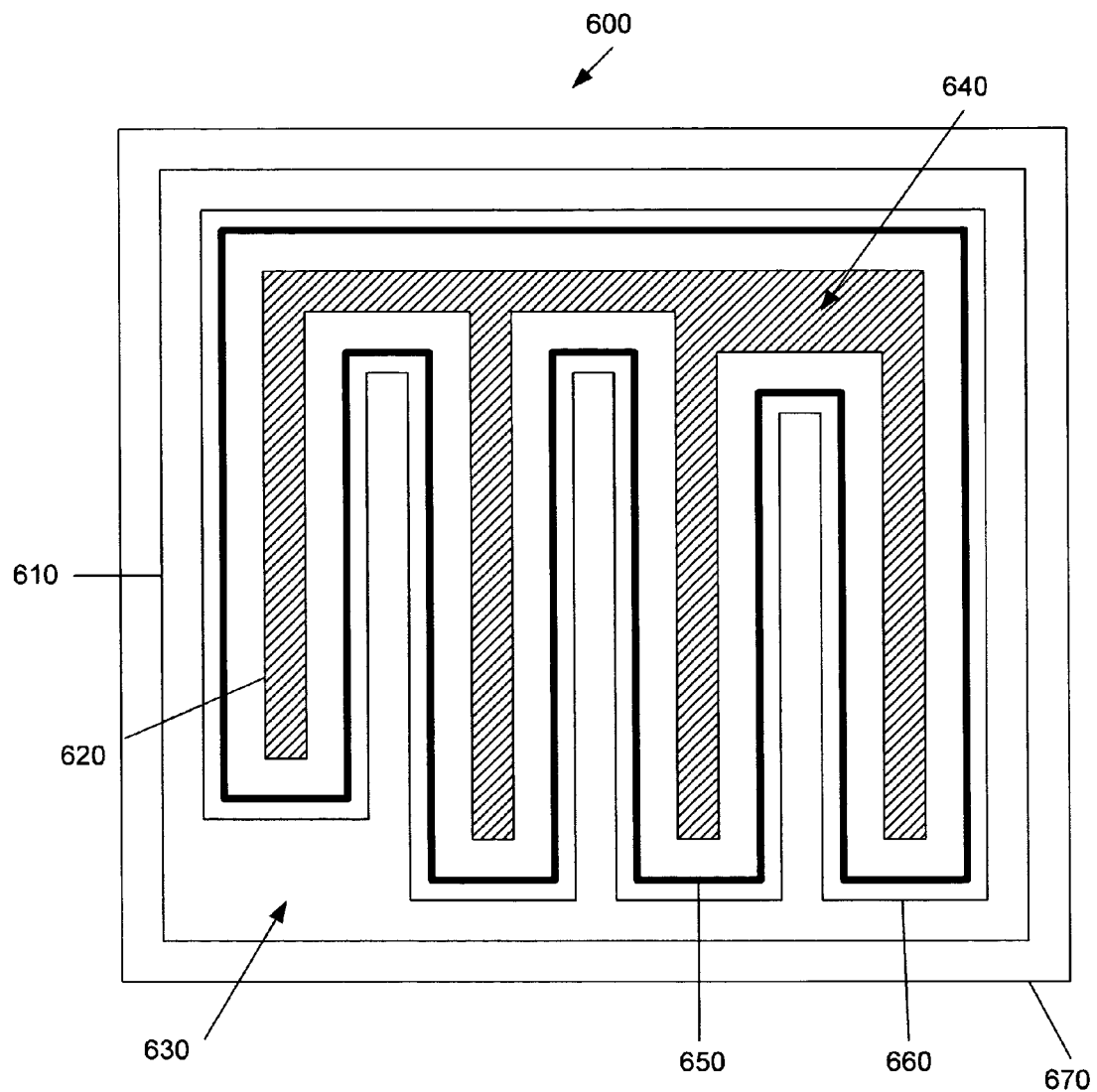
FIG. 6 shows an exemplary single chip, top view layout.

FIG. 6 shows an exemplary top view of a single chip 600 incorporating the LCT structure. As shown, a source n+ metallization area 610 and a drain n+metallization area 620 may form interdigitated fingers connected by a source bond pad 630 and a drain bond pad 640, respectively. A pinch-off region (e.g., groove/trench 650 or a low doped channel region) may be formed in a passivating dielectric region 660 surrounding the drain region 620. The entire chip may be formed on a substrate 670. Of course, other configurations of the source and drain regions may be implemented, for example, they may form a serpentine chip layout. Different configurations of the bond pads may be used including multiple source and drain bond pads with isolated fingers on the same chip.

Figure 7:
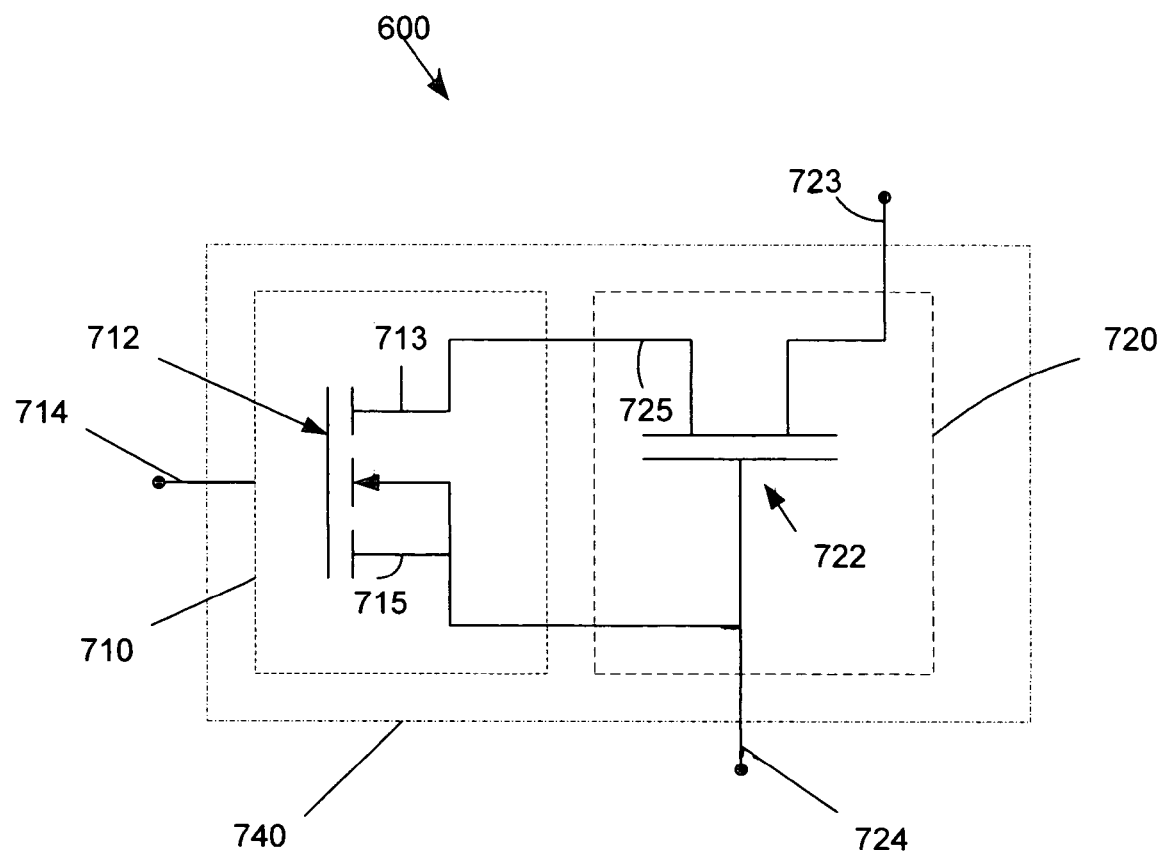
FIG. 7 shows an exemplary cascode configuration using a widebandgap lateral channel transistor with conventional low voltage components.

FIG. 7 shows an exemplary two-stage cascode configuration 700 using a LCT. The first stage 710 (e.g., a driver stage) of the cascode configuration 700, shown in FIG. 7, may be implemented using a low voltage, high current transistor 712, such as, for example, a MOSFET, an intelligent power module, a microwave HEMT, a HBT, a BJT or a MMIC with end driver. The second stage 720 is implemented using a widebandgap (WBG) high voltage LCT 722 that is operated in the common-gate mode. Source 725 of the LCT 722 is connected to the drain 713 (or collector for bipolar devices) of the first stage transistor 712. The source 715 (or emitter for bipolar devices) of the first stage transistor 712 and the gate 724 of the LCT 722 are connected together. The drain 723 of the LCT 722 may be connected to a high voltage source (e.g., 120 V to 15 kV). The two stage composite structure 700 provides a high power transistor 740 that may be used with conventional circuits. Conventional gate drive circuits used to operate a low voltage MOSFET do not need to supply high continuous currents in order to control the operation of the composite high power transistor.

Figure 8:
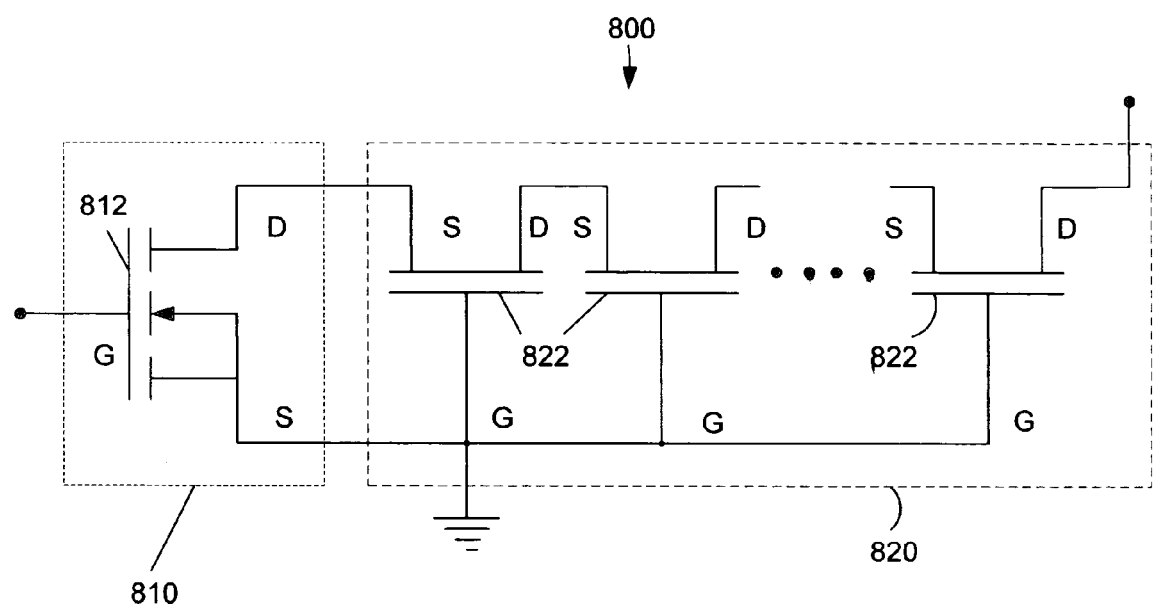
FIG. 8 shows exemplary multiple cascoded stages of a lateral channel transistor with low voltage conventional components.

Since the gate terminal of the composite cascoded MOSFET/LCTs of FIG. 7 (and FIG. 8 shown below) is a low voltage MOSFET, the requirements on the gate drive circuits are correspondingly low continuous currents. In one implementation, the first stage transistor should have a breakdown voltage that is slightly greater than $V_{pinch}$ of the LCT 722. In addition, the first and second stage transistors may have closely matched thermal characteristics.

FIG. 8 shows another implementation using the LCT with a multiple stage cascode configuration 800 for use in high voltage applications (e.g., a voltage range of 2 kV to 25 kV). As shown in FIG. 8, a first stage 810 low voltage transistor 812 is followed by a second stage 820 including multiple WBG LCTs 822 in cascode configuration. The first stage transistor 812 (or driver) may be implemented using a low voltage transistor, such as, for example, the "normally-off" power MOSFET. However, other transistors or devices also may be used, such as, for example, an Intelligent Power Module (IPM) or an intelligent transistor with voltage, current, and temperature sensing circuits.

The drain of the first stage transistor 812 (or IPM) is connected to the source of the first of the cascoded WBG LCT 822. The source of the first stage transistor 812 and all the gates of the WBG LCTs 822 are grounded. The cascoded WBG LCTS 822 are connected source to drain. The last WBG LCT's drain is connected to a high voltage power source.

As shown in FIG. 8, the cascoded configuration 800 may be designed such that $V_{pinch}$ of each subsequent WBG LCT 822 of the cascoded LCT is adjusted to account for the voltage drop in all the previous cascaded WBG LCTs 822. For example, if two LCTs are present in a three transistor cascode, the $V_{pinch}$ of the second LCT may be expressed as: $V_{pinch,\ 2nd\ LCT} = V_{pinch,\ 1st\ LCT} + I \times R$, where I and R are the rated current and resistance of first LCT.

One advantage of the LCT cascoded configuration 800 shown in FIG. 8 is that the need for a complex, expensive network of voltage balancing diodes and/or capacitances in multiple cascodes (found in some conventional power circuits) may be eliminated because a higher voltage may be sustained between gate-source junctions of the WBG LCTs.

In addition to power device applications, the LCT also may be used in microwave applications. For microwave or radio frequency (RF) applications, the first stage 710 may be implemented using a HEMT, a modulation doped FET (MODFET), a HBT, or an end stage of a MMIC. These first stage devices may be normally-on or normally-off devices, depending on their suitability to their application in a circuit. The LCT may be used advantageously in microwave and RF circuits because of the reduced capacitances between the terminals.

Figure 9:
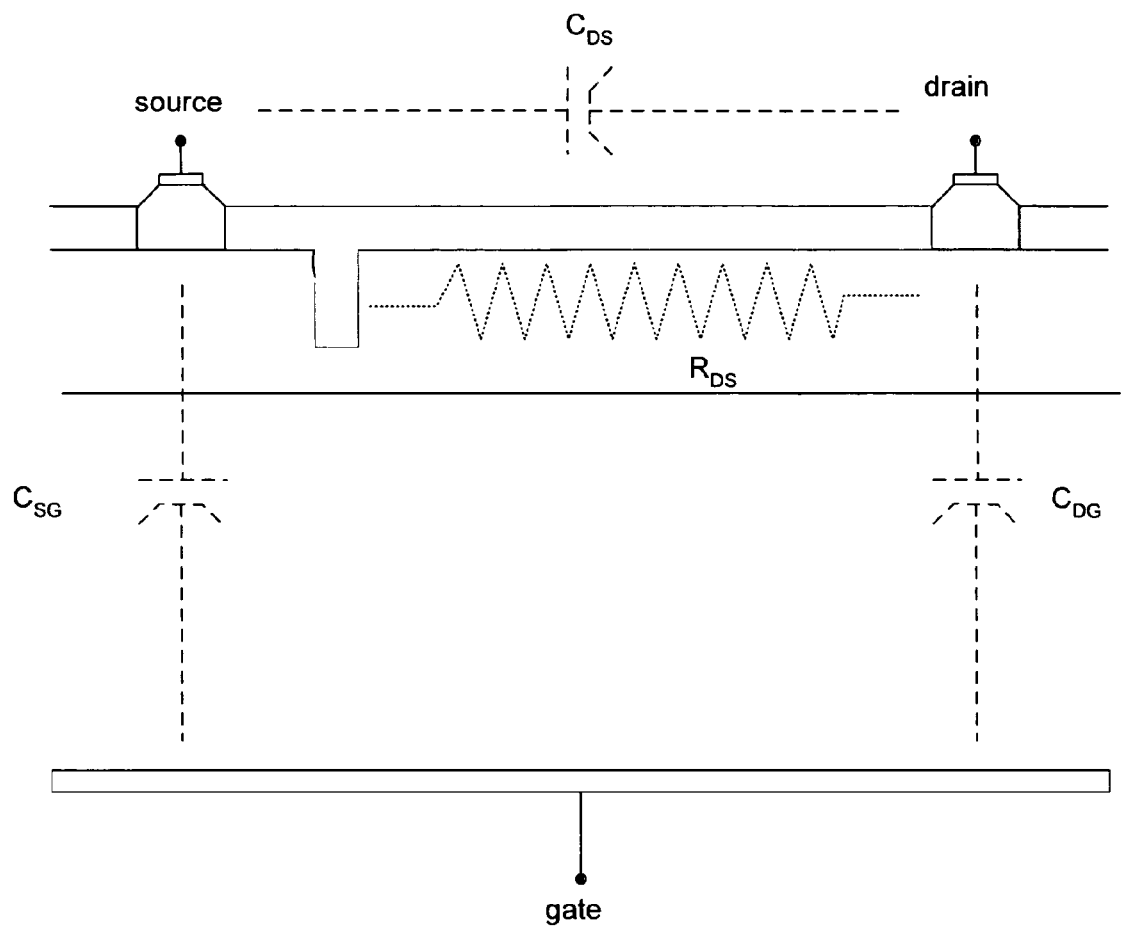
FIG. 9 shows an exemplary lateral channel transistor with illustrated capacitances between terminals.

FIG. 9 illustrates the capacitances between the terminals of a LCT and the resistance between the groove/trench and the drain. The capacitances between terminals (e.g., source to drain $C_{SD}$, source to gate $C_{SG}$, and drain to gate $C_{DG}$) are smaller than conventional transistors for corresponding applications because the spacing between terminals are larger than conventional transistors and because of the low doping between gate and other terminals, as explained in further detail below.

The gate to source capacitance per unit area may be expressed as:

$$C_{GS} = \frac{\varepsilon \times \varepsilon_r}{d_{GS}}$$

where $\varepsilon$ is the effective dielectric constant of the dielectric(s) between the gate and the source regions, and $d_{GS}$ is the effective spacing between the source and drain terminals. Conventional microwave MESFETs space the source and gate approximately 0.1 to 5 µm apart, resulting in a relatively high capacitance. The LCT incorporates a fundamental paradigm shift in design for high frequency transistors achieved by placing the gate on the opposite side of the wafer from the source and drain. As a result, the LCT has a substantially larger thickness of 100 to 500 µm between the source and the gate. In addition, the lower doping of the layers underlying the channel region (e.g., layers 110 and 120 of FIG. 1) cause the depletion region to extend much farther into the substrate as compared to those in highly doped channel regions of a MESFET. The MESFET also requires a higher doped channel to provide a low enough resistance during on-state operation. Since the depleted region thickness determines the capacitance between any two terminals, each of the capacitances—between gate and source, source and drain, and gate and drain, can be made correspondingly lower in the LCT. From these equations it can be seen that the capacitance of the LCT may be 10 to 500 times smaller than conventional MESFETs and top gated JFETs. As a result, the performance of the LCT for microwave (as well as power applications) is much better than conventional structures made with widebandgap semiconductors because the gate to source, gate to drain, and source to drain capacitances are smaller than conventional structures (such as, for example, MESFETs) that are currently used for these applications.

Linearity in microwave transistors is considered another key performance parameter. The input control voltage of microwave transistors should be directly proportional to the output current or voltage to provide distortion-free amplification of input signals. The cascode configuration of a first stage microwave HEMT/HBT and a second stage WBG LCT also may be used to achieve better drain current/gate voltage ($I_D/V_G$) linearity by appropriately changing the doping profile in channel layer (e.g., layer 130, or layer 140 (if layer 130 not present)). For example, conventional input transistors usually have an $I_D/V_G$ relationship such as $I_D \propto V_G^2$, however, a more desirable relationship is $I_D \propto V_G$. If the doping profile of a LCT along the vertical direction in the channel layer is uniformly decreasing with depth, a net $I_D/V_G$ relationship close to $I_D \propto V_G$ is provided. Examples of such doping profiles include $$N_D(y) \propto \frac{1}{y}, \quad N_D(y) \propto \frac{1}{y^2},$$

or increasing power of 1/y, where y=0 corresponds to the bottom of the pinch-off groove, and an increasing y goes towards the PN junction A simple way to achieve this is through the tail region of a Gaussian implant profile, or a graded implant regimen.

Variations of the LCT Cell

Figure 10:
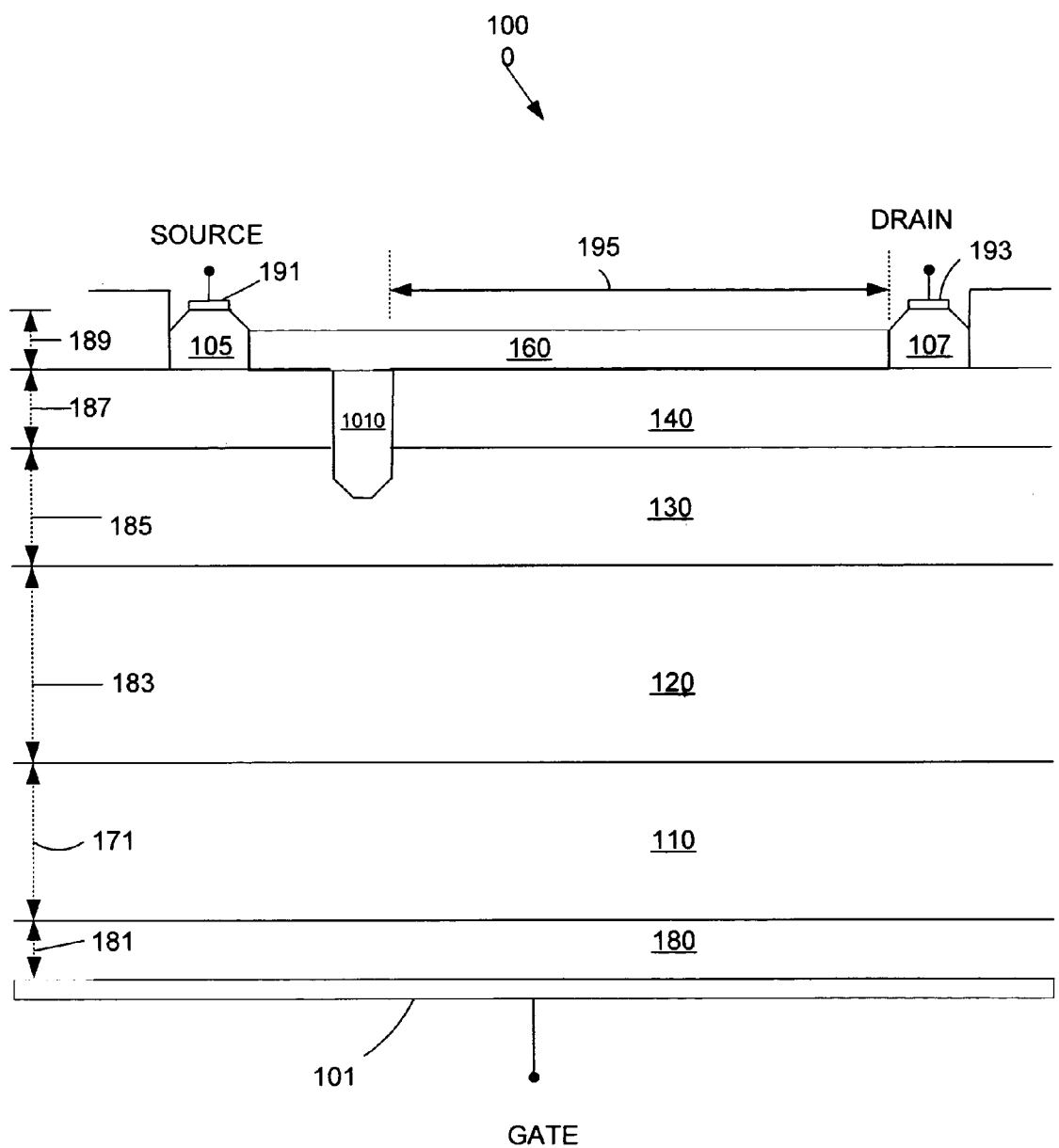
FIG. 10 shows an exemplary p+ blocker variation of the lateral channel transistor cell structure.

FIG. 10 shows a p+ blocker variation of the basic LCT structure of FIG. 1. As shown in FIG. 10, the pinch-off region may be implemented using a p+ implanted region (p+ Blocker) 1010. Instead of an etched region (e.g., a groove 150 in FIG. 1), which might be more difficult to control under some fabrication conditions, a highly doped, p+ region 1010 may be formed by ion implantation in the layer 140 and/or into layer 130 to leave only enough of the channel region so that the desired $V_{pinch}$ is provided. The p+ implanted region 1010 may be located in relation to the source and drain region in the manner described above for the groove 150. The p+ region may be doped at $10^{16}$ cm$^{-3}$ to $10^{22}$ cm$^{-3}$ with a depth of 0.1 to 2 µM. The p+ region may be covered with a passivating dielectric layer 160.

Figure 11:
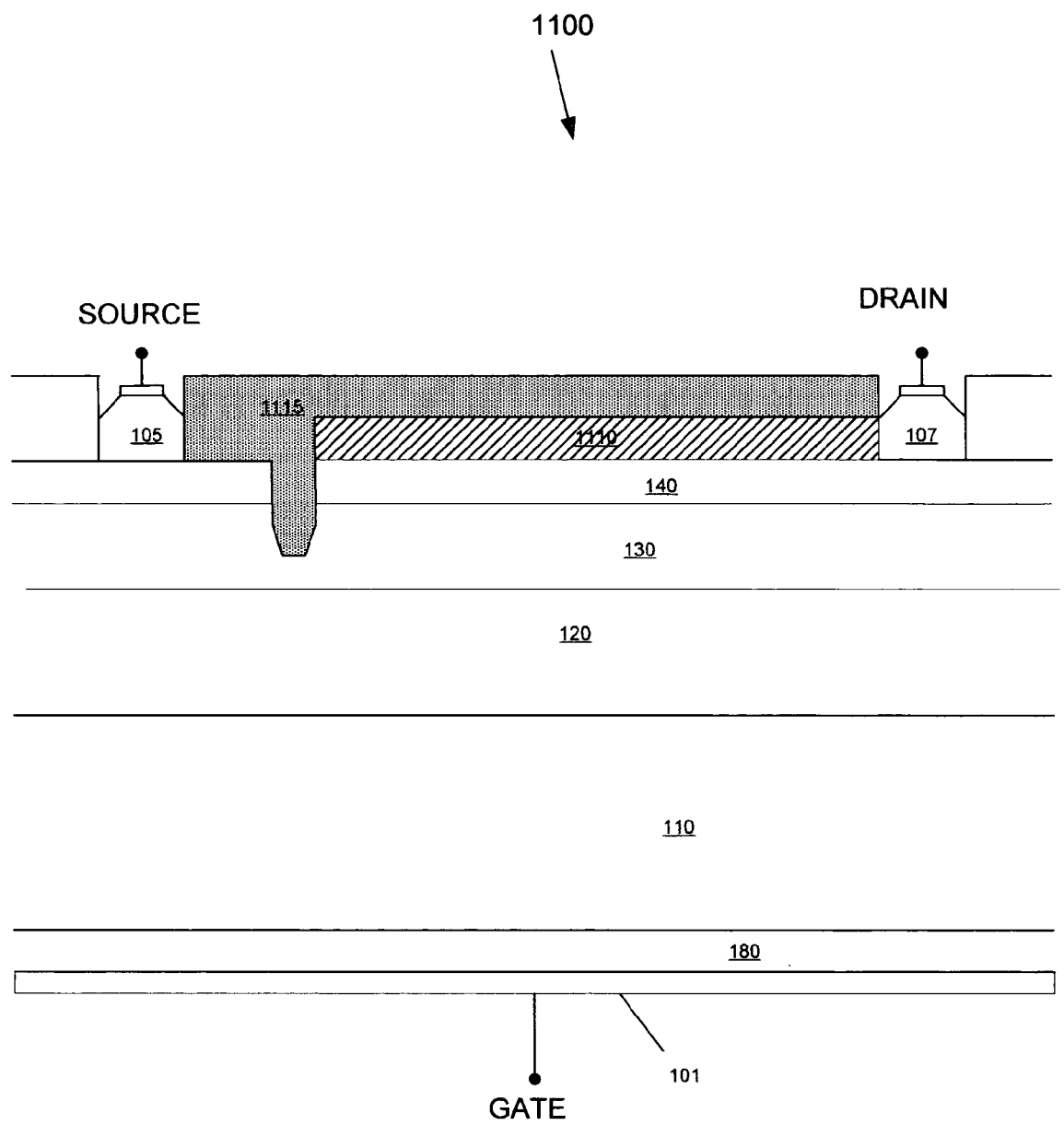
FIG. 11 shows an exemplary lateral channel transistor with a p compensator layer with a LCT.

FIG. 11 illustrates another implementation for a LCT 1100 including an optional top p-type layer 1110 that may be provided for optimal electric field shaping. The top p-type layer 1110 may be implanted in the passivating dielectric layer 1115 that is used to fill the groove 150. The top p-type layer may be uniformly doped across the top of layer 140 with a thickness such that the $V_{pinch}$ is less than the inherent junction voltage of the semiconductor used.

Figure 12:
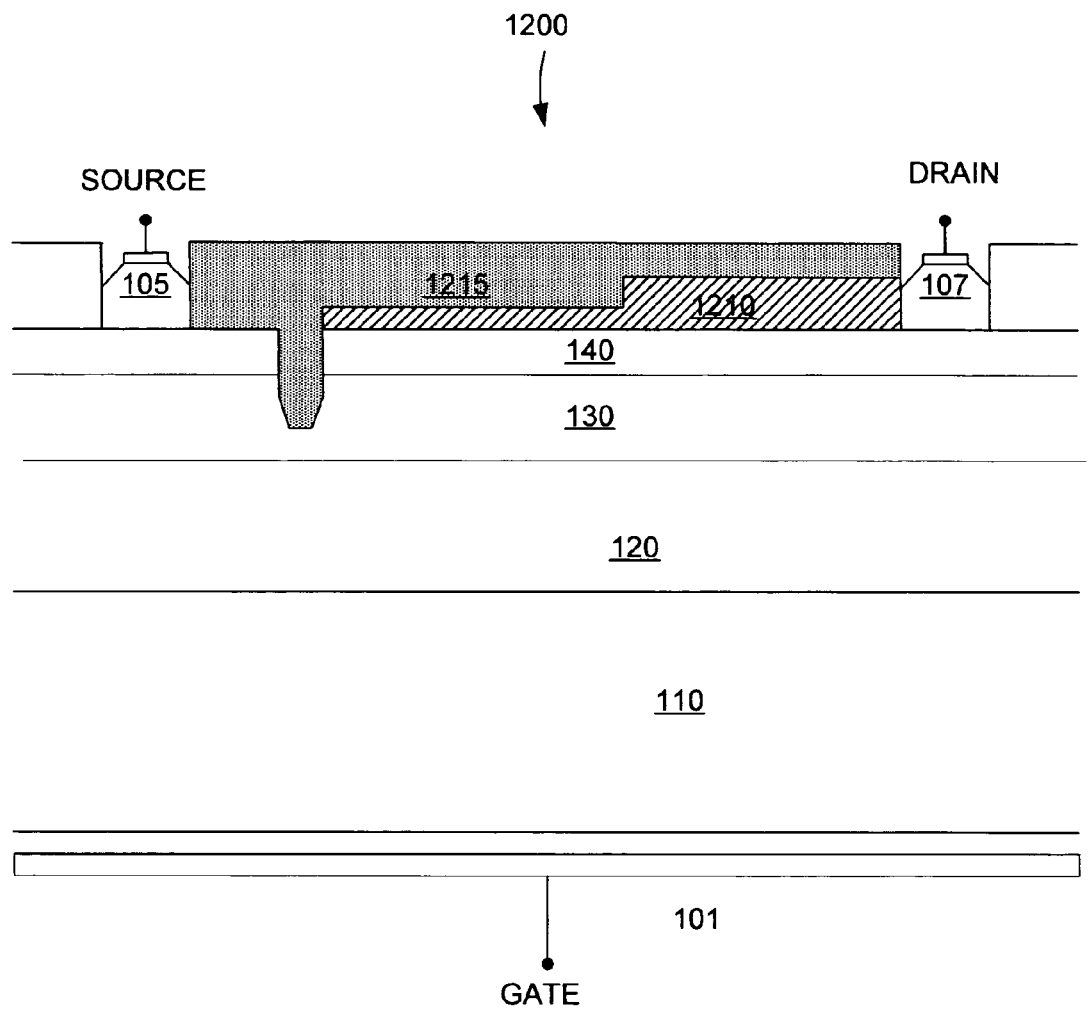
FIG. 12 shows an exemplary lateral channel transistor with graded n-type doping of the compensator layer.

FIG. 12 shows another implementation of an LCT to provide an approximated linearly increasing doping profile of the layer 140 using a stepwise increasing n-type dose from the source contact towards the drain contact. As shown, an n-type extension 1210 of the layer 140 has higher dose approaching the high voltage (drain) junction. A passivating dielectric layer 1215 may be formed between the source region and drain region filing the groove and covering the layer 140 including the extension 1210.

Figure 13:
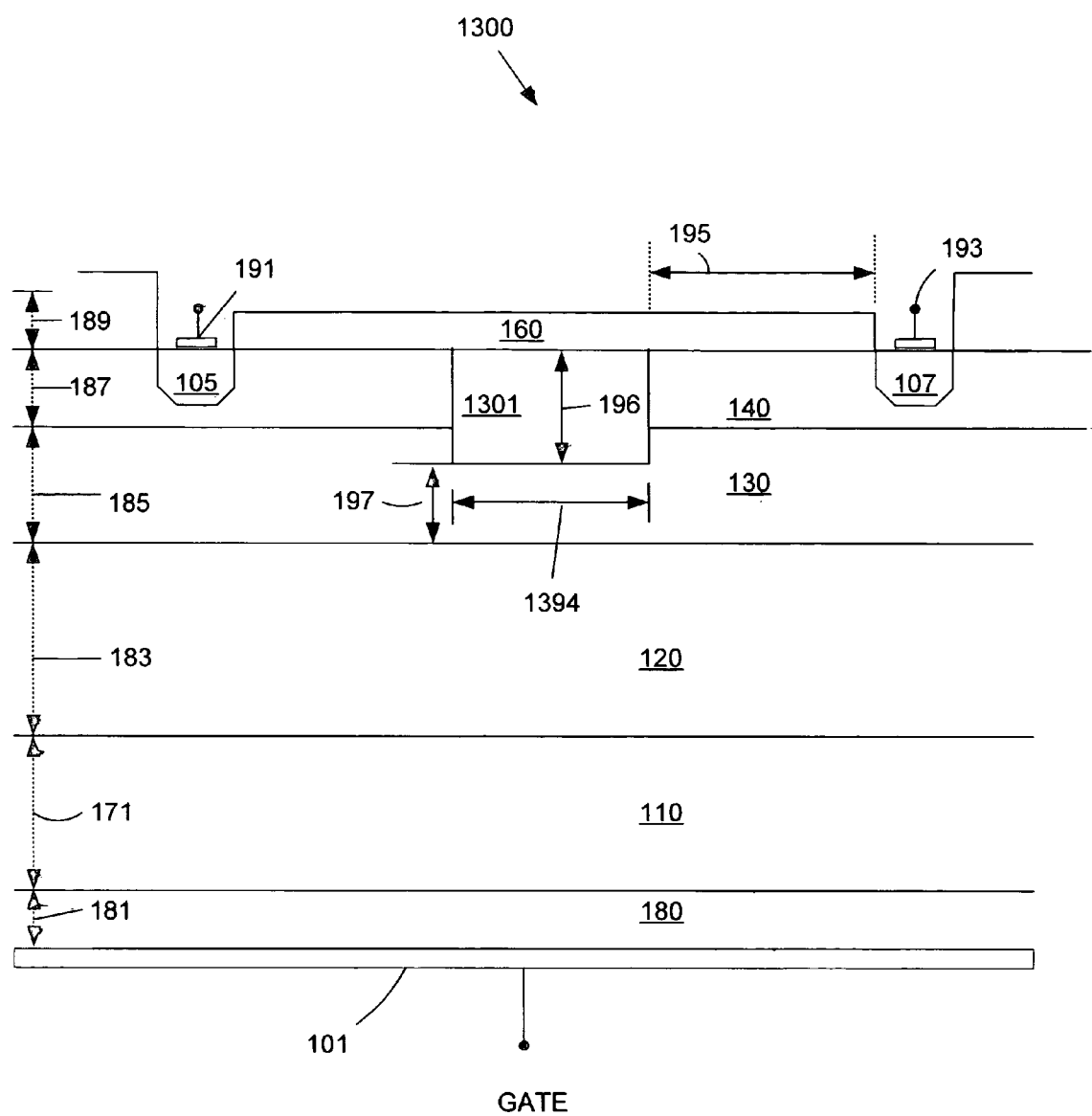
FIG. 13 shows an exemplary lateral channel transistor with low doped pinch-off region.

FIG. 13 shows a LCT 1300 with a pinch-off region implemented using a low doped region 1301. According to this implementation the source region 105 and drain region 107 may be implanted in layer 140. In addition, a portion of layer 140 may be formed as the low doped region 1301 having doping $N_D$ (as explained above). The low doped region 1301 may be used to pinch-off the current between the source and drain regions. The low-doped region 1310 may be formed equidistant from the source and drain regions with a width 1396 of $W_{pinchoff}$, which is less than the distance separating the source and drain regions. The area between the source and drain regions may be filled with a passivating dielectric layer 160 that covers the low-doped portion 1301.

Figure 14:
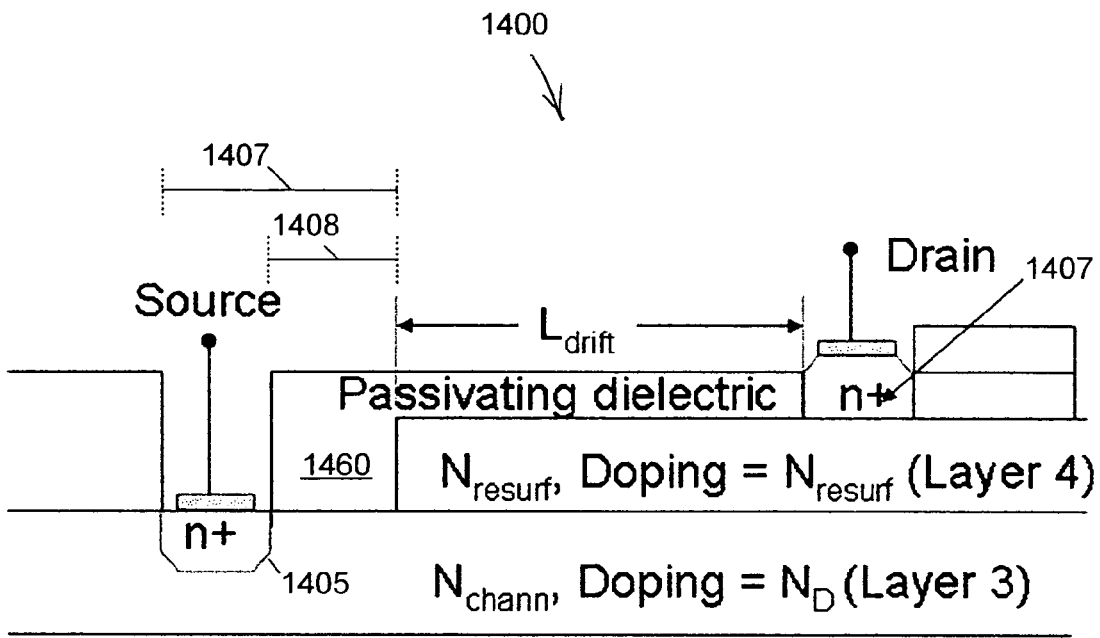
FIG. 14 shows an exemplary bipolar lateral channel transistor with p+ source region formed within the low doped pinch-off layer.

FIG. 14 shows a LCT 1400 with a source n+region 1405 formed in layer 130. The LCT 1400 may be formed by exposing a portion 1407 of layer 140 (or correspondingly growing region 140 with a mask to create portion 1407) to form the pinch-off region 1408. The source region 1405 may be implanted in layer 130. The pinch-off region 1408 of portion 1407 begins at the source region and has a width of $V_{pinch}$ ending at a distance of $L_{drift}$ from the drain region. The area between the source region and drain region including area 1408 may be filled with a passivating dielectric layer 1460.

Widebandgap semiconductors like silicon carbide (SiC) and diamond offer excellent properties for the realization of high performance, next generation power and microwave (RF) devices. These properties include: (a) an order of magnitude higher breakdown electric field; (b) a much higher thermal conductivity; and (c) a wider bandgap than silicon. A high breakdown electric field allows the design of power devices with thinner and higher doped blocking layers. This allows design of power devices with 2 orders of magnitude lower on-resistance in majority carrier devices. The high thermal conductivity allows dissipated heat to be readily extracted from the device. The large bandgap results in a much higher operating temperature and higher radiation hardness. Hence, a larger power can be applied to the device for a given junction temperature.

Conventional power and microwave transistors made with these semiconductors face various challenges in terms of performance and ease of manufacture. Three major performance parameters are: on-resistance for a given area (called specific on-resistance), breakdown voltage, and switching speed. There exists a fundamental trade-off between specific on-resistance and the breakdown voltage achieved using a particular thickness of semiconductor. Counter-intuitively, lateral power devices offer one half to one quarter resistance for a given breakdown voltage as compared to vertical power devices. Yet a vast majority of transistors are designed with a vertical design because most conventional designs in Si (the dominant material for power device realization) use such a design. A vertical design is used because semi-insulating and insulating versions of Si are difficult to achieve as compared to highly conducting versions. On the other hand, many widebandgap transistors occur in semi-insulating and insulating versions more readily.

Ion implantation and dopant diffusion is a much more challenging technology for most widebandgap semiconductors as compared to Si. Since many power transistor designs in Silicon use ion implantation and diffusion, many power device designs in widebandgap continue to use these steps for conventional device realization. This results in low yields and high costs.

The LCT eliminates many of these challenges of widebandgap transistors. The LCT has the important advantage of a lateral BV using widebandgap materials to achieve a low specific on-resistance as compared to conventional vertical power device designs. The specific doping and thicknesses of various layers may be designed as required to provide a specific desired performance for any particular application.

Many power device designs like the MOSFET and MESFET suffer from high source to gate capacitances because of a small spacing between the source and gate terminals. Through the LCT's unique placement of gate terminal on the opposite end of the wafer as compared to the source and drain terminals, the LCT realizes a much lower capacitance between all the device terminals. Since terminal capacitances are the primary determining factors for the switching speed. As a result, the LCT has a distinct advantage over other transistor designs in widebandgap transistors.

A number of exemplary implementations have been described. Nevertheless, it will be understood that various modifications may be made. For example, suitable results may be achieved if the steps of described techniques are performed in a different order and/or if components in a described system, architecture, device, or circuit are combined in a different manner and/or replaced or supplemented by other components. Accordingly, other implementations are within the scope of the following claims.

What is claimed is:

1. A lateral channel transistor (LCT) formed in a widebandgap semiconductor comprising:
    one or more layers of the widebandgap semiconductor having a first conductivity type and a first and a second surface;
    one or more layers of the widebandgap semiconductor having a second conductivity type formed on the first surface of the one or more layers of the first conductivity type, including at least a resurf layer;
    a gate formed on the second surface of the one or more layers of the first conductivity type;
    a source region in contact with the resurf layer;
    a drain region in contact with the resurf layer spaced apart from the source region;
    a current conduction path in the one or more layers of the second conductivity type between the source region and the drain region; and
    a pinch-off groove formed in the resurf layer between the source region and the drain region having a width less than the distance between the source region and the drain region to pinch-off the current conduction path.

2. The LCT of claim 1 having a lateral breakdown voltage between the source region and the drain region and a vertical breakdown voltage between the drain region and the gate, wherein the vertical breakdown voltage is greater than or equal to the lateral breakdown voltage.

3. The LCT of claim 1 having a blocking voltage of 300 V to 25 kV.

4. The LCT of claim 1 wherein the one more layers of the first conductivity type includes a substrate layer having a carrier concentration of dopant atoms of 0 $cm^{-3}$ to $1 \times 10^{22}$ $cm^{-3}$.

5. The LCT of claim 4 wherein the substrate layer has a thickness of 100 to 500 μm.

6. The LCT of claim 1 wherein the resurf layer has a carrier concentration of dopant atoms of $1 \times 10^{15}$ $cm^{-3}$ to $1 \times 10^{19}$ $cm^{-3}$.

7. The LCT of claim 10 wherein the resurf layer has a thickness of 0.01 to 5 μm.

8. The LCT of claim 1 wherein the one or more layers of the first conductivity type include a backgate layer beginning at the first surface of the one or more layers of the first conductivity type and forming a p-n junction with the one or more layers of the second conductivity type, wherein the backgate layer has a carrier concentration of dopant atoms of less than $10^{17}$ $cm^{-3}$.

9. The LCT of claim 8 wherein backgate layer has a thickness of 0.1 to 200 μm.

10. The LCT of claim 1 wherein the pinch-off groove is 0.1 to 20 μm wide.

11. The LCT of claim 1 wherein the pinch-off groove is positioned at a distance of 0.1 μm to 100 μm from the source region and 1 to 200 μm from the drain region.

12. The LCT of claim 1 wherein the pinch-off groove is filled with a dielectric including one of silicon dioxide, silicon nitride, polyimide, deposited silicon carbide, and deposited diamond.

13. The LCT of claim 1 wherein the region between the pinch-off groove and first surface of the one or more layers of the first conductivity type is doped with a uniformly decreasing doping profile.

14. The LCT of claim 1 wherein the semiconductor has a bandgap EG greater than 2 eV and less than 8 eV.

15. The LCT of claim 1 wherein the semiconductor is silicon carbide.

16. The LCT of claim 15 wherein the face of the silicon carbide is one of 0001, 000-1, and 11–20.

17. The LCT of claim 15 wherein the semiconductor has a bandgap EG greater than 2.1 eV and less than 4 eV.

18. The LCT of claim 1 wherein the semiconductor is diamond.

19. The LCT of claim 18 wherein the semiconductor has a bandgap EG of approximately 5 eV.

20. The LCT of claim 1 wherein the semiconductor is aluminum nitride.

21. The LCT of claim 20 wherein the semiconductor has a bandgap EG of approximately 6.1 eV.

22. The LCT of claim 1 wherein the semiconductor is gallium nitride.

23. The LCT of claim 22 wherein the semiconductor has a bandgap EG greater than 3 eV and less than 5 eV.

24. The LCT of claim 1 wherein having a blocking gain of greater than or equal to 20.

25. The LCT of 24 claim wherein the blocking gain is expressed as $BV/V_{pinch}$, where BV is the voltage blocked at the drain and the $V_{pinch}$ is the pinch-off voltage causing pinch-off of the conduction path.

26. The LCT of claim 1 wherein having a specific on resistance of less than 300 mΩ-$cm^2$.

27. The LCT of claim 1 wherein the first conductivity type is p type and the second conductivity type is n type.

28. The LCT of claim 1 where the conductivity type of the source region is a highly doped p+ type and the conductivity type of the drain is a highly doped n+ type.

29. The LCT of claim 1 further comprising a passivating dielectric layer formed between the source region and the drain region covering the pinch-off groove and the passivating dielectric layer fills the groove.

30. The LCT of claim 29 further comprising a compensating layer between the passivating dielectric layer and the resurf layer configured to shape a lateral electric field of the LCT.

31. The LCT of claim 1 wherein the resurf layer has a stepwise increasing dose of the second conductivity type from the pinch-off region to the drain region.

32. The LCT of claim 1 further comprising an expitaxially grown extension of resurf layer of the second conductivity type between the drain region and the gate region.

33. The LCT of claim 32 wherein the extension provides an increasing dose profile of the second conductivity type from the pinch-off groove to the drain region.

34. The LCT of claim 1 further comprising an ion implanted extension of resurf layer of the second conductivity type between the pinch-off groove and the drain region.

35. The LCT of claim 34 wherein the extension provides an increasing dose profile of the second conductivity type from the pinch-off groove to the drain region.

36. A lateral channel transistor (LCT) formed in a widebandgap semiconductor comprising:
- one or more layers of the widebandgap semiconductor having a first conductivity type and a first and a second surface;
- one or more layers of the widebandgap semiconductor having a second conductivity type formed on the first surface of the one or more layers of the first conductivity type, including at least a resurf layer;
- a gate formed on the second surface of the one or more layers of the first conductivity type;
- a source region in contact with the resurf layer;
- a drain region in contact with the resurf layer spaced apart from the source region;
- a current conduction path in the one or more layers of the second conductivity type between the source region and the drain region; and
- a pinch-off region formed in the resurf layer between the source region and the drain region having a width less than the distance between the source region and the drain region to pinch-off the current conduction path, wherein the pinch-off region is a low doped region.

37. The LCT of claim 36 wherein the pinch-off region is positioned at a distance of 0.1 μm to 100 μm from the source region and 1 to 200 μm from the drain region.

38. A lateral channel transistor (LCT) formed in a widebandgap semiconductor comprising:
- one or more layers of the widebandgap semiconductor having a first conductivity type and a first and a second surface;
- one or more layers of the widebandgap semiconductor having a second conductivity type formed on the first surface of the one or more layers of the first conductivity type, including at least a resurf layer;
- a gate formed on the second surface of the one or more layers of the first conductivity type;
- a source region in contact with the resurf layer;
- a drain region in contact with the resurf layer spaced apart from the source region;
- a current conduction path in the one or more layers of the second conductivity type between the source region and the drain region; and
- a pinch-off region formed in the resurf layer between the source region and the drain region having a width less than the distance between the source region and the drain region to pinch-off the current conduction path, wherein the pinch-off region is p conductivity type blocker region.

39. The LCT of claim 38 having a blocking voltage of 300 V to 25 kV.

40. The LCT of claim 38 wherein the pinch-off region is positioned at a distance of 0.1 μm to 100 μm from the source region and 1 to 200 μm from the drain region.

41. A lateral channel transistor (LCT) formed in a widebandgap semiconductor comprising:
- one or more layers of the widebandgap semiconductor having a first conductivity type and a first and a second surface;
- one or more layers of the widebandgap semiconductor having a second conductivity type formed on the first surface of the one or more layers of the first conductivity type, including at least a resurf layer and a channel layer formed between the resurf layer and the first surface;
- a gate formed on the second surface of the one or more layers of the first conductivity type;
- a source region embedded in the channel layer;
- a drain region in contact with the resurf layer spaced apart from the source region;
- a current conduction path in the channel layer between the source region and the drain region; and
- a pinch-off region formed in the resurf layer between the source region and the drain region beginning at the source region having a width less than the distance between the source region and the drain region to pinch-off the current conduction path.

42. A lateral channel transistor (LCT) formed in a widebandgap semiconductor comprising:
- one or more layers of the widebandgap semiconductor having a first conductivity type and a first and a second surface;
- one or more layers of the widebandgap semiconductor having a second conductivity type formed on the first surface of the one or more layers of the first conductivity type, including at least a resurf layer and a channel layer formed between the resurf layer and the one or more layers of the first conductivity type;
- a gate formed on the second surface of the one or more layers of the first conductivity type;
- a source region in contact with the resurf layer;
- a drain region in contact with the resurf layer spaced apart from the source region;
- a current conduction path in the one or more layers of the first conductivity type between the source region and the drain region; and
- a pinch-off groove formed in the resurf layer between the source region and the drain region having a width less than the distance between the source region and the drain region to pinch-off the current conduction path wherein the pinch-off groove partially penetrates the channel layer.

43. The LCT of claim 42 wherein the channel layer has a carrier concentration of dopant atoms of $1 \times 10^{13}$ cm$^{-3}$ to $1 \times 10^{18}$ cm$^{-3}$.

44. The LCT of claim 43 wherein the thickness of the channel region is 0.01 to 10 μm.

* * * * *